US012772802B2

(12) United States Patent

Herrault

(10) Patent No.: US 12,772,802 B2
(45) Date of Patent: Oct. 20, 2026

(54) END-POINT DETECTION FOR BACKSIDE METAL THICKNESS CONTROL

(71) Applicant: HRL Laboratories, LLC, Malibu, CA (US)

(72) Inventor: Florian G. Herrault, Agoura Hills, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 685 days.

(21) Appl. No.: 18/081,394

(22) Filed: Dec. 14, 2022

(65) Prior Publication Data

US 2024/0203798 A1 Jun. 20, 2024

(51) Int. Cl.

| | |
|---|---|
| ***H10P 74/00*** | (2026.01) |
| ***H10P 72/70*** | (2026.01) |
| ***H10W 46/00*** | (2026.01) |
| ***H10W 70/05*** | (2026.01) |
| ***H10W 70/60*** | (2026.01) |
| ***H10W 70/65*** | (2026.01) |
| ***H10W 90/00*** | (2026.01) |

(52) U.S. Cl.

CPC ........ *H10P 74/238* (2026.01); *H10P 72/7402* (2026.01); *H10W 46/00* (2026.01); *H10W 70/05* (2026.01); *H10W 70/611* (2026.01); *H10W 70/614* (2026.01); *H10W 70/65* (2026.01); *H10W 90/401* (2026.01); *H10P 72/7428* (2026.01); *H10P 72/743* (2026.01); *H10W 46/301* (2026.01)

(58) Field of Classification Search

CPC . H01L 22/26; H01L 23/5385; H01L 23/5389; H01L 23/544; H01L 2223/54426

See application file for complete search history.

(56) References Cited

U.S. PATENT DOCUMENTS

| | | | |
|---|---|---|---|
| 5,276,455 | A | 1/1994 | Fitzsimmons |
| 5,371,404 | A | 12/1994 | Juskey |
| 5,503,962 | A | 4/1996 | Caldwell |
| 6,114,246 | A | 9/2000 | Weling |
| 6,249,439 | B1 | 6/2001 | DeMore |

(Continued)

FOREIGN PATENT DOCUMENTS

KR 10-2013-0117329 10/2013

OTHER PUBLICATIONS

PCT International Preliminary Report on Patentability from PCT/US2023/016861 dated Nov. 5, 2024.

(Continued)

*Primary Examiner* — Brian Turner

(74) *Attorney, Agent, or Firm* — Ladas & Parry, LLP

(57) ABSTRACT

A method of controlling the thickness of a layer of material applied to a surface, where the surface has one or more bodies of another material disposed therein, the another material being significantly harder than the first mentioned material, the one or more bodies of another material being disposed on the surface before the layer of material is applied to the surface, the layer of material when applied to the surface having a sufficient thickness to cover the one or more bodies of the another material, the layer of material then being mechanically reduced in thickness, such as by polishing, to expose at least a portion of the one or more bodies of the another material.

10 Claims, 8 Drawing Sheets

Figure 1A:
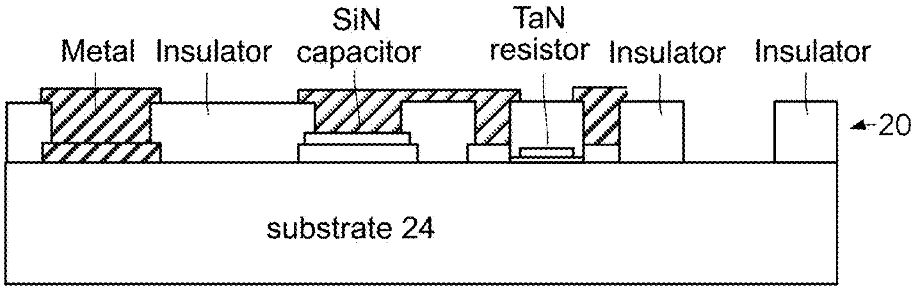
Figure 1B:
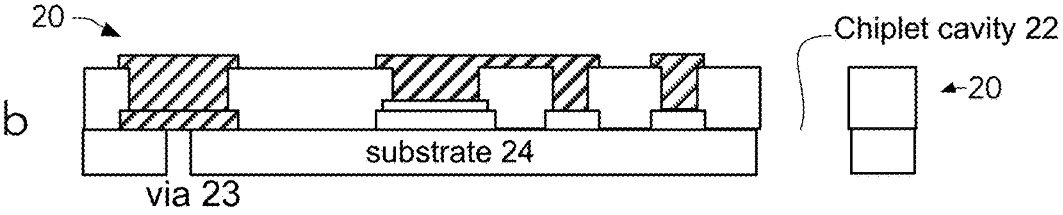
Figure 1C:
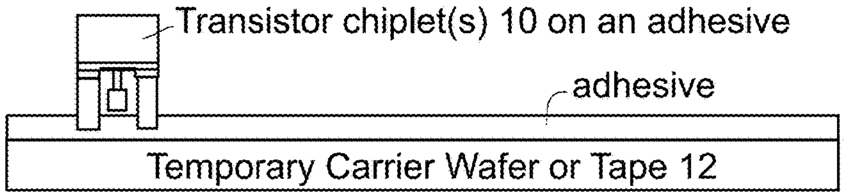
Figure 1D:
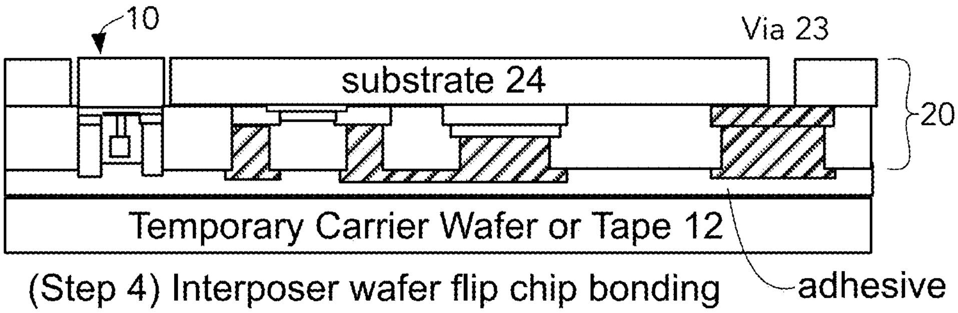
Figure 1E:
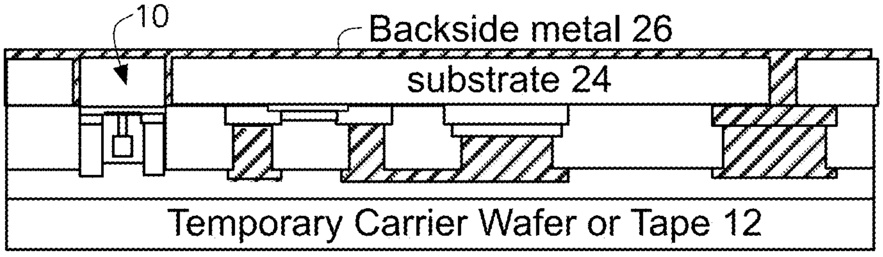
Figure 1F:
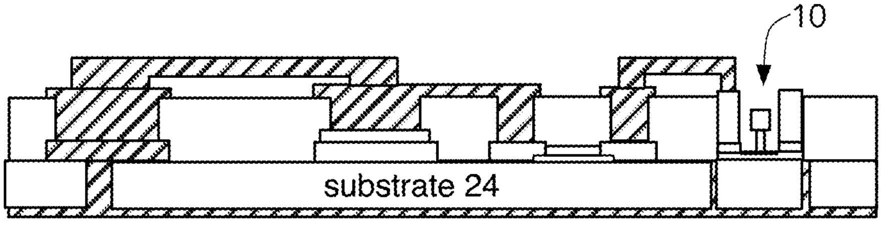

(New step 5b) Backside metallization Planarization with in-situ end-point

(56) References Cited

U.S. PATENT DOCUMENTS

| | | | | |
|---|---|---|---|---|
| 6,821,872 | B1 * | 11/2004 | Liao | H01L 21/76829 257/E21.507 |
| 6,900,765 | B2 | 5/2005 | Navarro | |
| 6,989,592 | B2 | 1/2006 | Chang | |
| 7,292,381 | B1 | 11/2007 | Patterson | |
| 7,733,265 | B2 | 6/2010 | Margomenos | |
| 7,777,315 | B2 | 8/2010 | Noquil | |
| 8,334,592 | B2 | 12/2012 | Bhagwagar | |
| 8,415,783 | B1 * | 4/2013 | Rahman | H10P 74/273 257/725 |
| 8,617,927 | B1 | 12/2013 | Margomenos | |
| 9,059,140 | B1 | 6/2015 | Margomenos | |
| 9,214,404 | B1 | 12/2015 | Margomenos | |
| 9,337,124 | B1 | 5/2016 | Herrault | |
| 9,385,083 | B1 | 7/2016 | Herrault | |
| 9,508,652 | B1 | 11/2016 | Herrault | |
| 9,780,014 | B1 | 10/2017 | Margomenos | |
| 9,837,372 | B1 | 12/2017 | Herrault | |
| 10,079,160 | B1 | 9/2018 | Margomenos | |
| 10,833,039 | B2 | 11/2020 | Yu | |
| 10,957,537 | B2 | 3/2021 | Herrault | |
| 10,998,273 | B2 | 5/2021 | Herrault | |
| 2001/0019938 | A1 * | 9/2001 | Skrovan | B24B 53/017 451/72 |
| 2002/0110952 | A1 | 8/2002 | Gris | |
| 2003/0006499 | A1 | 1/2003 | Choi | |
| 2005/0077596 | A1 | 4/2005 | Bauer | |
| 2006/0027635 | A1 | 2/2006 | Schaenzer | |
| 2006/0091509 | A1 | 5/2006 | Zhao | |
| 2006/0105496 | A1 | 5/2006 | Chen | |
| 2006/0292747 | A1 | 12/2006 | Loh | |
| 2007/0025092 | A1 | 2/2007 | Lee | |
| 2007/0075420 | A1 | 4/2007 | Lu | |
| 2007/0247851 | A1 | 10/2007 | Villard | |
| 2008/0099770 | A1 | 5/2008 | Mendendorp | |
| 2008/0128897 | A1 | 6/2008 | Chao | |
| 2008/0179725 | A1 | 7/2008 | Chia | |
| 2008/0224320 | A1 | 9/2008 | Palmade | |
| 2008/0298021 | A1 | 12/2008 | Ali | |
| 2009/0108437 | A1 | 4/2009 | Raymond | |
| 2009/0134421 | A1 | 5/2009 | Negley | |
| 2009/0294941 | A1 | 12/2009 | Oh | |
| 2009/0309209 | A1 | 12/2009 | Chen | |
| 2010/0140799 | A1 | 6/2010 | Do | |
| 2010/0327465 | A1 | 12/2010 | Shen | |
| 2011/0140216 | A1 | 6/2011 | Qu | |
| 2011/0266569 | A1 | 11/2011 | Basin | |
| 2012/0037935 | A1 | 2/2012 | Yang | |
| 2012/0217627 | A1 | 8/2012 | Tseng | |
| 2013/0168803 | A1 | 7/2013 | Haddad | |
| 2014/0021610 | A1 | 1/2014 | Von Koblinski | |
| 2014/0203239 | A1 | 7/2014 | Schubert | |
| 2016/0111616 | A1 | 4/2016 | Margalit | |
| 2016/0293557 | A1 | 10/2016 | Topak | |
| 2016/0308270 | A1 | 10/2016 | Ding | |
| 2016/0329232 | A1 | 11/2016 | Golda | |
| 2017/0077297 | A1 * | 3/2017 | Pawlak | H10D 30/63 |
| 2017/0363589 | A1 | 12/2017 | Kumar | |
| 2018/0019178 | A1 | 1/2018 | Lin | |
| 2018/0148328 | A1 | 5/2018 | Agache | |
| 2019/0229019 | A1 * | 7/2019 | Shu | H10D 84/0147 |
| 2019/0385865 | A1 | 12/2019 | Kong | |
| 2020/0006307 | A1 * | 1/2020 | Tsai | H01L 25/18 |
| 2023/0098033 | A1 * | 3/2023 | Xie | H10B 61/00 257/427 |

OTHER PUBLICATIONS

U.S. Appl. No. 17/361,186, filed Jun. 28, 2021, Herrault.

From U.S. Appl. No. 17/361,186, filed Jun. 28, 2021, (nonpublication request filed), Florian G. Herrault, et al.

From U.S. Appl. No. 13/306,827 (now U.S. Pat. No. 8,617,927), Notice of Allowance mailed on Aug. 15, 2013.

From U.S. Appl. No. 13/306,827 (now U.S. Pat. No. 8,617,927), Office Action mailed on Mar. 7, 2013.

From U.S. Appl. No. 13/306,827 (now U.S. Pat. No. 8,617,927), Office Action mailed on Jan. 9, 2013.

From U.S. Appl. No. 14/080,691 (now U.S. Pat. No. 9,214,404), Notice of Allowance mailed on Aug. 12, 2015.

From U.S. Appl. No. 14/080,691 (now U.S. Pat. No. 9,214,404), Office Action mailed on Apr. 16, 2015.

From U.S. Appl. No. 14/080,691 (now U.S. Pat. No. 9,214,404), Office Action mailed on Dec. 17, 2014.

From U.S. Appl. No. 16/158,212 (now U.S. Pat. No. 10,998,273), Notice of Allowance mailed on Jan. 8, 2021.

From U.S. Appl. No. 16/158,212 (now U.S. Pat. No. 10,998,273), office action mailed on Dec. 4, 2020.

From U.S. Appl. No. 16/158,212 (now U.S. Pat. No. 10,998,273), office action mailed on Jul. 29, 2020.

From U.S. Appl. No. 16/158,212 (now U.S. Pat. No. 10,998,273), office action mailed on Jan. 16, 2020.

From U.S. Appl. No. 16/158,212 (now U.S. Pat. No. 10,998,273), office action mailed on Jul. 26, 2019.

From U.S. Appl. No. 16/557,811 (now U.S. Pat. No. 10,957,537), Notice of Allowance mailed on Nov. 16, 2020.

From U.S. Appl. No. 16/557,811 (now U.S. Pat. No. 10,957,537), Office Action mailed on May 11, 2020.

PCT International Search Report and Written Opinion from PCT/US2018/055516 dated Feb. 1, 2019.

PCT International Search Report and Written Opinion from PCT/US2019/050384 dated Jan. 20, 2020.

PCT International Preliminary Report on Patentability (Chapter I) with Written Opinion from PCT/US2018/055516 dated Jun. 23, 2020.

Chen, K.C., et al., "Thermal Management and Novel Package Design of High Power Light Emitting Diodes", National Kung University, Taiwan, Electronic Components and Technology Conference, 2008, pp. 795-797.

Chinoy, P. et al., "Manufacture of low-loss microwave circuits using HMIC technology," 1994 IEEE MTT-S International Microwave Symposium Digest (Cat. No. 94CH3389-4), San Diego, CA, USA, 1994, pp. 1137-1140, vol. 2.

Feeler, R., et al., "Next-Generation Microchannel Coolers", Northrop Grumman, Proceedings of SPIE 2008, vol. 6876, 8 pages.

Margomenos, A. et al. for "Wafer-Level Packaging Method Incorporating Embedded Thermal Management for GaN-Based RF Front-Ends," IEEE Intersociety Conference on Thermal and Thermomechanical Phenomena in Electronic Systems (ITHERM), May 27-30, 2014 in Orlando, Florida. (6 pages).

PCT International Search Report and Written Opinion from PCT/US2023/016861 dated Sep. 5, 2023.

* cited by examiner (Step 1) Interposer wafer with embedded passive devices or components (Step 2) Substrate thinning and via/cavity etching (Step 3) Chiplet pick, flip, and place (Step 4) Interposer wafer flip chip bonding (Step 5) Backside metallization (Sputter and Plate)

(Step 6) Demount and air bridge interconnect process.
Cross hatching denotes metal regions.

(Step 4) Interposer wafer flip chip bonding (Step 5a) Thick Backside metallization (Sputter and Plate)

(Step 5b) Backside metallization Planarization (New step 3) Chiplet pick, flip, and place + "Backside Metal End Point Detection Chiplet"

(New Step 4a) Interposer wafer flip chip bonding (New step 4b) Interposer wafer flip chip bonded (New step 5a) Thick Backside metallization (Sputter and Plate)

(New step 5b) Backside metallization Planarization with in-situ end-point

New Step 4b: Chiplets 11 disposed in interposer wafer 20 cavities 23, each having a width ~ 300 μm. The interposer wafer 20 has a thickeness of ~ 50 μm and the Chiplets 11 preferably project above the top surface of interposer by 5 - 10 μm New Step 5a:Thick backside metalization (sputter and plate)

New Step 5b: Backside metalization planarization using in-situ chiplet 11 as a planarizatrion stop

END-POINT DETECTION FOR BACKSIDE METAL THICKNESS CONTROL

CROSS REFERENCE TO RELATED PATENTS AND PATENT APPLICATIONS

This application is related to the technologies disclosed in U.S. Pat. No. 8,617,927 issued 31 Dec. 2013; U.S. Pat. No. 9,214,404 issued 15 Dec. 2015; and U.S. Pat. No. 10,998, 273 issued 4 May 2021, the disclosures of which are hereby incorporated herein by reference.

This application is also related to the technologies disclosed in U.S. patent application Ser. No. 17/361,186 filed 28 Jun. 2021, entitled "Singulation Process for Chiplets" the disclosure of which is hereby incorporated herein by reference.

STATEMENT REGARDING FEDERALLY SPONSORED RESEARCH OR DEVELOPMENT

None.

TECHNICAL FIELD

Semiconductor chip manufacturing: process control for controlling the thickness of a metal (or other) layer.

BACKGROUND

There exists a need in the art for manufacturing a device wafer or chip comprising an integrated circuit having a through-wafer or through-chip receiving cavity (which cavity may be filled, during manufacture, with a small component sometimes referred to as 'chiplets'), which need is addressed in US patents referred to above. These patents disclose Metal-Embedded Chip Assembly for Microwave Integrated Circuits (MECAMIC) devices and processes and teach the embedding, at the wafer-level, of microelectronic transistor chiplets into a device wafer (which may also be called an interposer) or chip (which again may also be called an interposer) that may have pre-fabricated interconnects and integrated circuits including, for example, passive components. This allows for a much faster manufacturing of the resulting chip or device, at lower cost, and a scaling up of transistor technologies to circuits without cost and cycle time burden techniques, particularly when the chiplets utilize fabrication techniques and components that are more expensive to utilize on a surface area basis than are the techniques and components utilized to make the device wafer or chip which receives one or more chiplets.

The chiplets may comprise a GaN or other semiconductor chemistry devices or even passive devices (resistors, capacitors, for example, on a substrate, such as, for example, a SiC substrate. Such chiplets may be used in the manufacture of the MECAMIC devices described in the aforementioned US patents or in other applications. The device wafers or chips 20 into which the chiplets 10 are embedded may be made by a lower cost manufacturing process than that used for the chiplets. So, the resulting integrated circuit or chip 20 may be primarily of a first material (a dielectric material, for example) and the transistor chiplets 10 may be formed primarily of a second material (such as of a III/V material system material like GaN), the second material being significantly more expensive to obtain and utilize than is the first material. The resulting interposer chip, device or wafer 20 typically contains significantly more of the first material than the second material and desirously has many of the benefits afforded by III/V material system transistors, but with manufacturing costs closer to that of silicon-based technologies.

The MECAMIC technology relies on the integration of the aforementioned transistor chiplets into the volume of device or interposer wafers via a backside electroformed metal anchoring approach. The backside metal provides structural mechanical integrity to the combination of chiplets and device/interposer wafer, as well as DC and RF electrical ground.

The circuit designs in MECAMIC may use microstrips for the matching network and interconnects on 50-μm-thick SiC (or 60-μm-thick high-resistivity silicon). The substrate thickness is critical since it sets the characteristic impedance of the transmission line, and those skilled in the art will recognize that it should be close to 50Ω.

The backside metal thickness is also critical. However, currently there is no known way to measure its thickness in-situ during the process.

This disclosure focuses the design, fabrication and integration of chiplets used for "in-situ end-point detection" for backside thickness control for MECAMIC. Embedded in the wafers, these chiplets provide unique process control, but are not part of the actual product circuit (only seen at the wafer level). The chiplets also provide "polishing stop" capabilities and backside alignment capabilities (required for creating backside dicing streets).

This disclosure provides for the accurate control the backside metal thickness through an in-situ chiplet integration approach (instead of a timed removal which is not accurate). This disclosure also can provide a way to significantly slow down polishing ("polishing stop") of the chiplets and can provide alignment markers for subsequent frontside and backside processing steps.

BRIEF DESCRIPTION OF THE INVENTION

In one aspect the present invention provides an apparatus comprising an electronic element having a first thickness with one or more end point detection chiplets disposed in cavities in the electronic element, the one or more end point detection chiplets having a second thickness greater than the first thickness and a first hardness, the electronic element being at least partially covered with a material having a hardness less than said first hardness of the end point detection chiplets and having a thickness limited by the thickness of the end point detection chiplets.

In another aspect the present invention provides an apparatus comprising an electronic element having an interior surface with one or more end point detection chiplets disposed in cavities in the electronic element, the one or more end point detection chiplets protruding from said interior surface and having a first hardness, the electronic element being at least partially covered with a material having a hardness less than said first hardness of the end point detection chiplets and having a thickness limited by a distance by which the one or more end point detection chiplets protrude from said first surface.

In yet another aspect the present invention provides a method of controlling the thickness of a layer of material applied to a surface, where the surface has one or more bodies of another material disposed therein, the another material being significantly harder than the first mentioned material, the one or more bodies of another material being disposed on the surface before the layer of material is applied to the surface, the layer of material when applied to the surface having a sufficient thickness to cover the one or more bodies of said another material, the layer of material then being mechanically reduced in thickness, such as by polishing, to expose at least a portion of the one or more bodies of said another material.

BRIEF DESCRIPTION OF THE DRAWINGS AND APPENDICES

FIGS. 1*a* through 1*f* depict MECA/MECAMIC technology taught by U.S. Pat. No. 10,998,273 issued 4 May 2021.

Figure 2A:
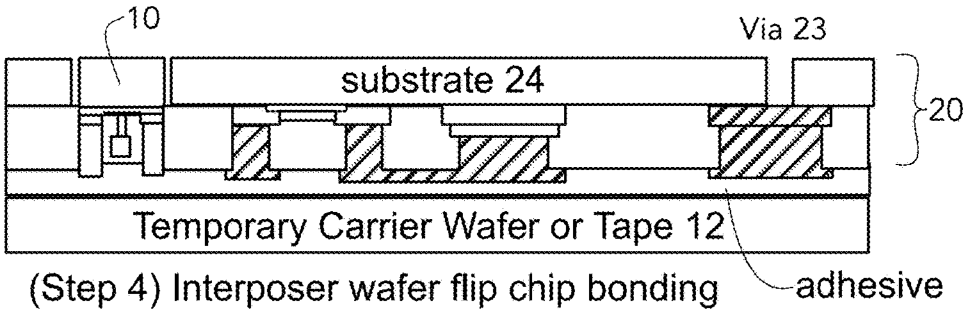
Figure 2B:
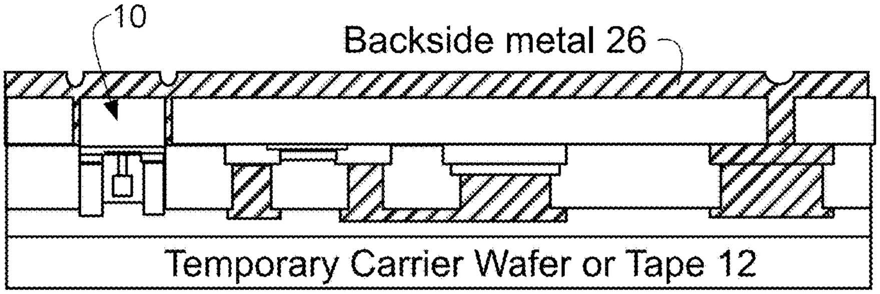
Figure 2C:
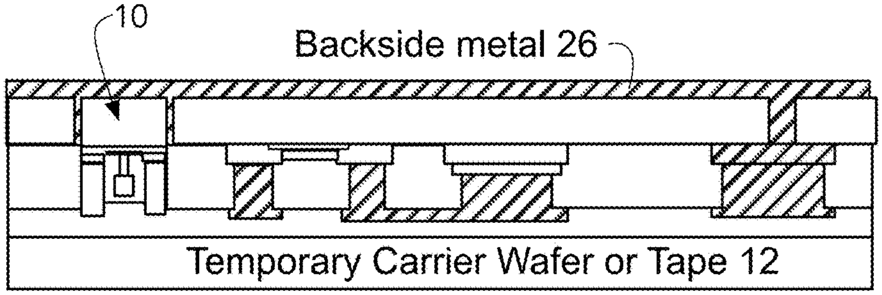

FIGS. 2*a* through 2*c* show additional details of a step 5 described with reference to FIGS. 1*a*-1*f*.

FIG. 3*a* through 3*e* depict an embodiment of the subject of presently disclosed technology.

Figure 3A:
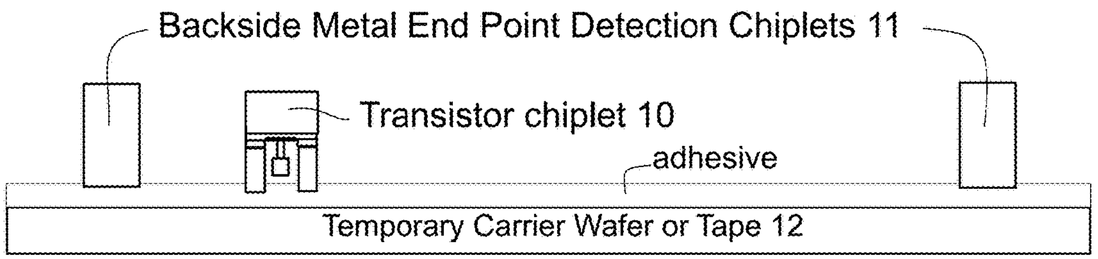
Figure 3B:
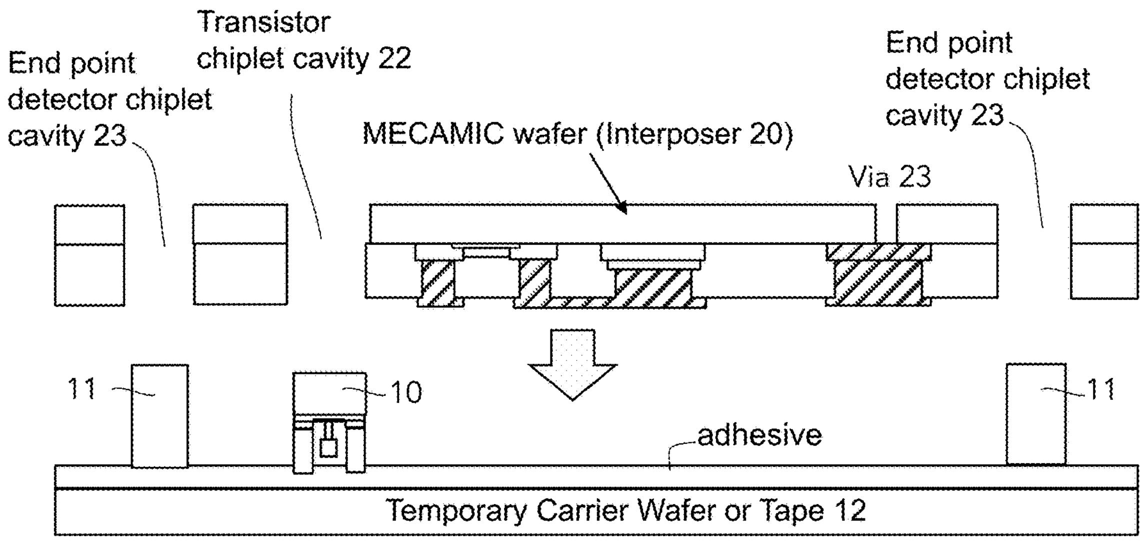
Figure 3C:
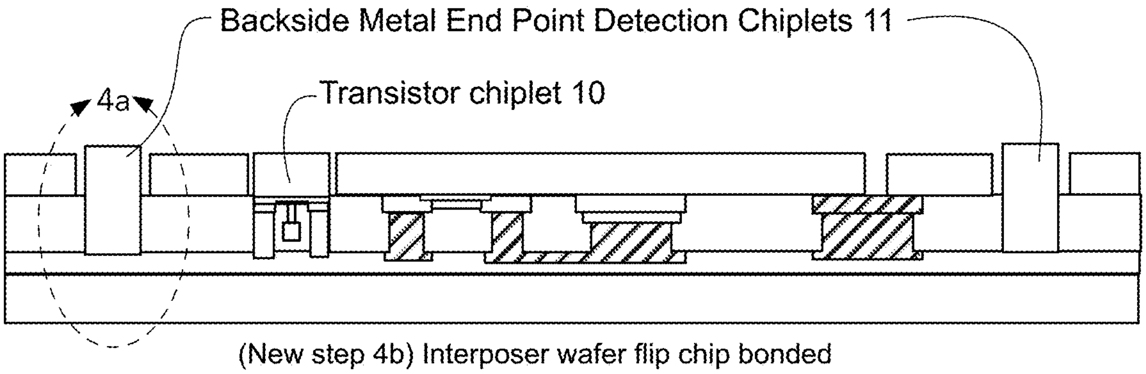
Figure 3D:
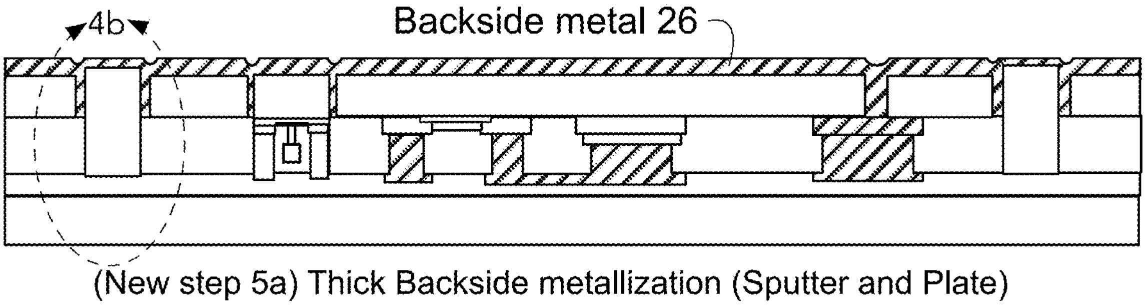
Figure 3E:
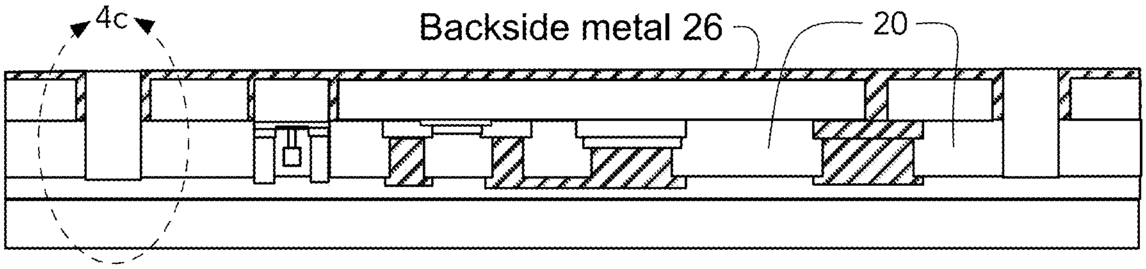
Figure 4A:
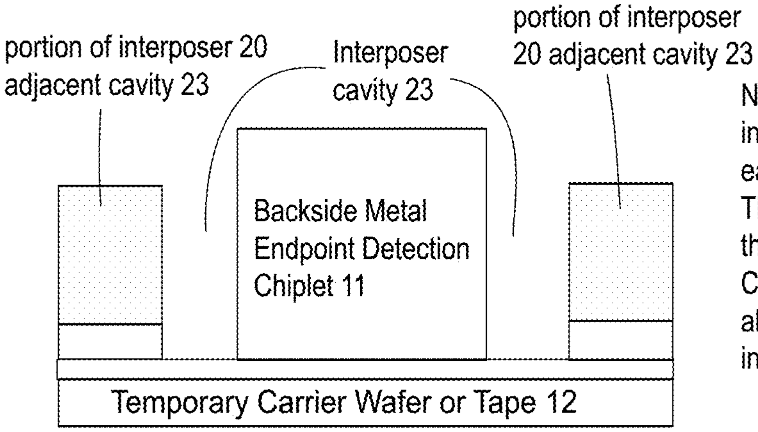
Figure 4B:
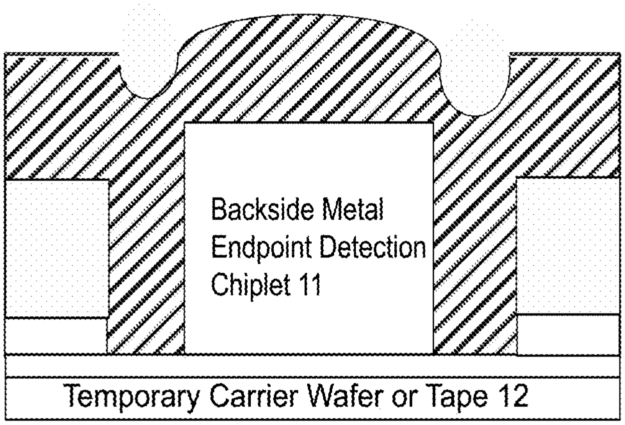
Figure 4C:
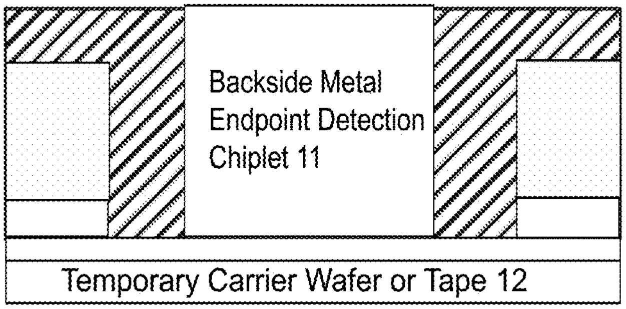

FIGS. 4*a* through 4*c* are close up views of an embodiment of the presently disclosed technology corresponding FIGS. 3*a*-3*e* with FIG. 4*a* being a detail of a portion of FIG. 3*c*, FIG. 4*b* being a detail of a portion of FIG. 3*d*, and FIG. 4*c* being a detail of a portion of FIG. 3*e*. In this figure, the chiplet alignment marks become visible after metal polishing.

Figure 5:
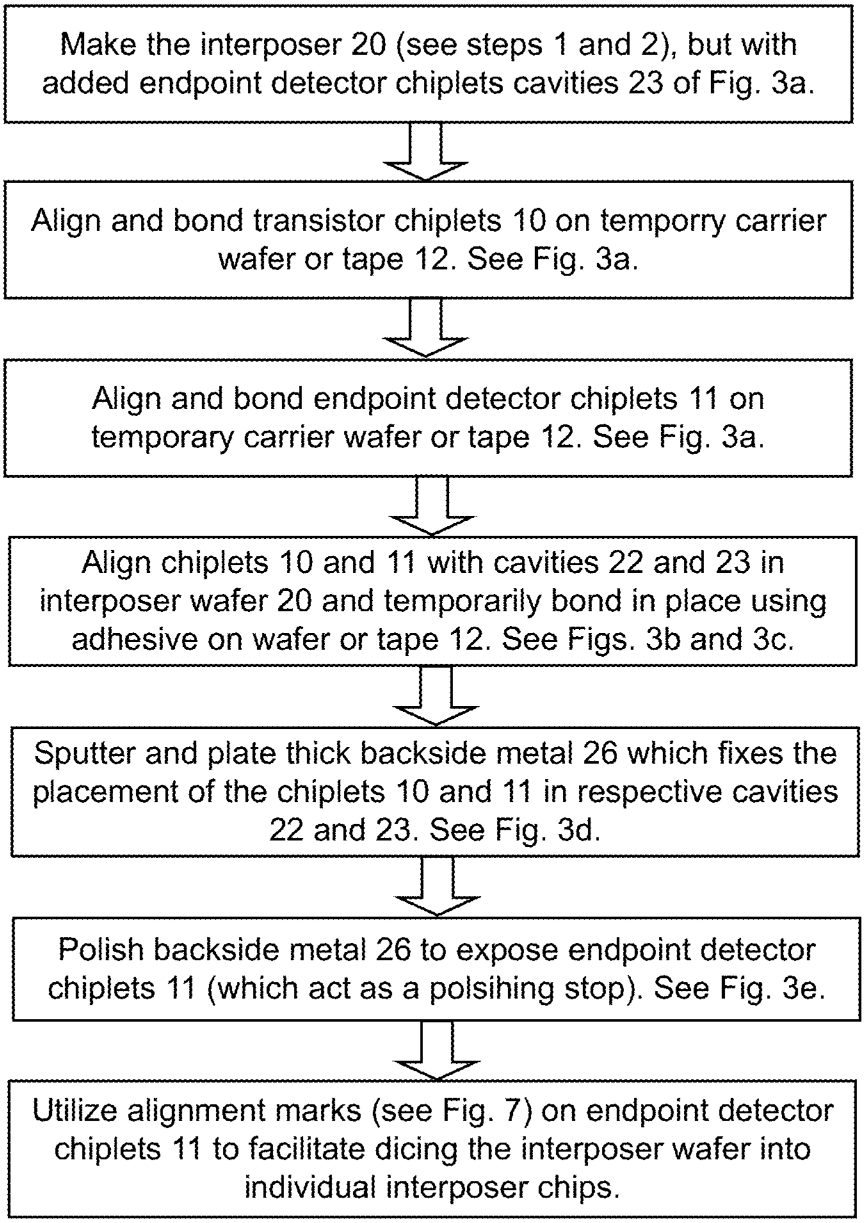

FIG. 5 presents a process flow block diagram.

Figure 6:
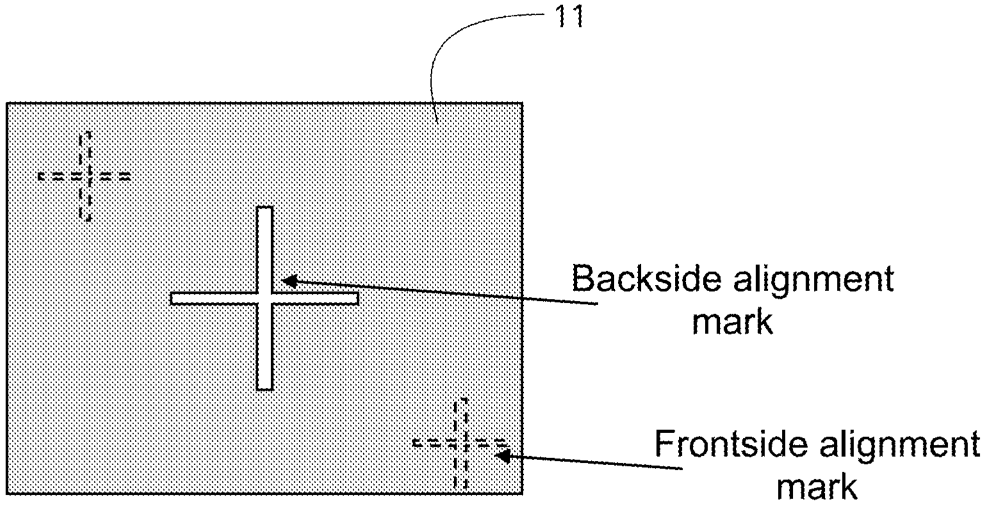

FIG. 6 depicts alignment markings etched in the chiplets, and will be visible after the metal polishing is completed.

Appendix A depicts an example of a MECAMIC interposer layout wafer 20.

Appendix B depicts an example of a MECAMIC interposer layout reticle (10 mm) and one example of an "end point detection" chiplet 11. This would give a chiplet every 10 mm on the wafer, but denser patterns can also be easily implemented.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

The MECAMIC (Metal Embedded Chiplet Assembly for Microwave Integrated Circuits) process enables rapid demonstration and low-cost manufacturing of RF integrated circuits. A fabrication approach was previously described in U.S. Pat. No. 10,998,273 issued 4 May 2021, and which is depicted by FIGS. 1*a*-1*f* hereof.

FIGS. 1*a* through 1*f* depict MECAMIC technology taught by U.S. Pat. No. 10,998,273 issued 4 May 2021. Transistor chiplets 10 are integrated into interposer wafers 20, which may be formed of a semiconductor dielectric material such as BCB, $SiO_2$, SiN, etc. The cross hatched regions denote a metal, preferably commonly used in semiconductor manufacturing. The interposer wafers 20 feature through-substrate chip/chiplet cavities 22. See steps 1 and 2 depicted by FIGS. 1*a* and 1*b*. The chiplets 10 are preferably formed on an adhesive-covered temporary carrier wafer 12 (step 3 depicted by FIG. 1*c*), flip chip bonded into the cavity 22 (see step 4 depicted by FIG. 1*d*) and then locked into place mechanically into the interposer wafer 20 by backside metal plating and polishing (see step 5 depicted by FIG. 1*e*). Step 5 is improved, as will be explained, according to inventive aspects of the present disclosure.

After step 5 a step 6 preferably occurs where the adhesive-covered temporary carrier wafer 12 is removed (the interposer wafers 20 with embedded transistors chiplets 10 are demounted from the adhesive-covered temporary carrier wafer 12) and additional interconnect metal (air bridges) are added as needed, for example, and microstrip transmission lines (not shown) to complete the circuits of the interposer 20. The interposer 20 is typically formed a number of passive elements, such as capacitors and/or resistors and a number of transistor chiplets 10. Only two passive elements and one chiplet 10 are shown in FIGS. 1*a*-1*f* for ease of illustration and explanation.

Typically, a large number of interposer chips are made simultaneously as a wafer. Only one interposer chip with one imbedded transistor chiplet 10 is shown for ease of illustration, it being understood that typically a large number of interposer chips would be manufactured at the same time as a wafer which is then diced later into individual interposer chips 20 and the individual chips 20 may embody many transistor chiplets 10.

The interposer 20 is typically formed using relatively inexpensive semiconductor processing technologies using, for example, silicon or SiC substrates, as opposed to more expensive semiconductor technologies, although more expensive semiconductor technologies may be used if desired. The chiplets 10, on the other hand, are typically formed using relatively more expensive semiconductor processing technologies using, for example, group III/V materials. So, the MECA/MECAMIC technology of FIGS. 1*a*-1*f* permits relatively expensive semiconductor processing technologies to be used to form transistors chiplets (for example) that are embedded in wafers formed utilizing less expensive fabrication technologies.

Interposer wafers, typically embodying many interposer chips (see Appendices A and B) are mated with wafer-disposed or tape-disposed transistor chiplets 10. This allows the interposer wafer to be manufactured using a relatively less expensive fabrication technology while the transistor chiplets 10, which typically only make up a small percentage of the overall area of an interposer chip, to utilize more expensive fabrication technologies.

A single interposer chip is shown in the figures, it being understood that generally speaking a large number of interposer chips would be made at the same time on a wafer. See Appendices A and B which show a wafer (Appendix A) and an individual interposer chip (Appendix B). In the following descriptions, the term wafer is used, but only a single interposer chip is depicted for ease of illustration. Also, the interposer chips (wafers) in the figures are of a far simpler circuit design than the interposer chip of Appendix B or wafer of Appendix A in order to more easily depict and describe the novel, aspects of the technology described herein.

Interposer wafers 20 are pre-fabricated with passive components (step 1), and thinned and etched for cavity fabrication (step 2). In parallel, transistor chiplets 10 are placed face down on a temporary carrier wafer. The chiplets 10 can alternatively be tape mounted as described in U.S. patent application Ser. No. 17/361,186 filed 28 Jun. 2021, entitled "Singulation Process for Chiplets".

The MECAMIC interposer wafer 20 is placed and bonded (face down) (step 4) with the wafer bearing the transistor chiplets 10, before forming backside metal 26 preferably through a combination of sputtered metal, electroplating, and polishing (step 5). The backside metal enables 1) mechanical locking of the chiplets in the interposer wafer, 2) a backside ground for DC and RF operations of the resulting chip, and 3) thermal management. After demounting the reconstructed wafer with integrated chiplets from the carrier, topside interconnects connecting the chiplets to the wafer are fabricated preferably using traditional microfabrication processes.

FIGS. 2*b* and 2*c* show additional details of step 5 described above, where step 5 is split into two steps 5*a* (see FIGS. 2*b*) and 5*b* (see FIG. 2*c*). FIG. 2*a* shows the prior step 4 which is also described above with respect to FIG. 1*d*. The transistor chiplets 10 and the MECAMIC interposer wafer 20 have approximately the same thickness (50 μm) according to the processing described with reference to FIGS. 1*a*-2*c*, but sometimes it is desirable to utilize thicker interposer wafers (which can happen if one uses a high-resistivity Si interposer wafer instead of SiC). The high-resistivity Si silicon wafer may be on the order of 60 μm thick to maintain the same characteristic impedance of microstrip transmission lines on the topside of the interposers as interposers made using SiC. Of course, there may be other reasons why the transistor chiplets 10 have a thickness that is different than the thickness of the interposer wafer 20. This thickness differential (60 μm versus 50 μm) presents a manufacturing difficulty as will now be described.

After the chiplets 10 are bonded on temporary carrier wafer 12 with adhesive, the interposer wafer 20 with prefabricated cavities 22 and vias is also aligned and placed face down on the temporary carrier wafer 12 (see Step 4 of FIG. 2*a* (which also appears as FIG. 1*d* in the discussion above)). In the MECAMIC processing, the chips 10 and interposes wafers 20 are preferably of the same thickness, but it does not necessarily have to be case as explained in the preceding paragraph. Subsequently, metal is sputtered on the stack, and metal plating is carried out. Because of the topography due to the embedded chips and vias, there is thick metal that needs to be polished back down to 5 to 10 μm (see step 5*b* depicted by FIG. 2*c*). However, at present, there is no in-situ technique to measure the metal thickness accurately during polishing. Also, with planarized backside metal, one cannot further align layers (such as with a dicing street).

As shown in step 5 (see FIG. 1*e* and FIG. 2*b*) the backside metal 26 is overplated and has some topography due to the via 23 and cavity 22 being filled with backside metal 26. As such, polishing is typically performed to make the backside metal 26 thickness more uniform.

The thickness of the backside metal 26 is important, especially as wafers are scaled up in diameter. For instance, wafer warpage can be observed if the backside metal 26 thickness or stresses are too large. As such, it is preferable to polish down (known generically as planarization) to less than 10 μm of thickness of the backside metal 26.

However, according the process described in U.S. Pat. No. 10,998,273 it does not describe a way to accurately control the backside metal 26 thickness during processing, which in turn makes it difficult to control the thickness and uniformity of the backside metal backside metal 26 after planarization. Further, the planarization makes it impossible to subsequently align lithography layers. As an example, the metal would typically be removed in the dicing street while aligning those to the frontside circuits. This cannot be done according to the processes described in the aforementioned US patent because there are no visible reference patterns on the backside of the interposer wafer.

To address these issues, the use of "process control" chiplets (alternatively called "end point detection" chiplets 11 herein) will now be described. Process steps 3, 4 and 5 described above are replaced with new versions thereof described below. Chiplets 11 are preferably formed of a material, such as SiC, and thus, in the disclosed embodiments, do not function as a traditional circuit-embodied chip, but the possibility that chiplets 11 might include circuitry is not excluded from the realm of possibility.

FIGS. 3*a* and 3*b* demonstrate a process flow beginning with FIG. 3*a* and then carrying over to FIG. 3*b*. The "process control" or "end point detection" chiplets 11 are preferably 5 to 10 μm thicker (taller) than the MECAMIC interposer wafer 20. First, the transistors chiplets 10 are bonded, and then the chiplets 11 are bonded face down (see new step 3 of FIG. 3*a*). Of course, this could be reversed with the chiplets 11 bonded first followed by chiplets 10. Next, an interposer MECAMIC wafer 20 is also bonded (see new steps 4*a*-4*b* and FIGS. 3*b*-3*c*). Note that the interposer 20 includes additional cavities 23 for receiving these new chiplets 11. As shown by FIG. 3*c*, depicting new step 4*b*, the chiplets 11 protrude out of the back surface of the interposer wafer 20 by a height equal to (or slightly greater than) the desired thickness of the soon-to-be deposited metal layer 26. The backside metal layer 26 is then deposited preferably by sputtering metal and electroplating metal, similar to the original approach described in the aforementioned U.S. patent and shown herein as new step 5*a* (see FIG. 3*d*).

After depositing the metal 26, it is polished down with the "process control" or "end point detection" chiplets 11 providing an in-situ endpoint detection surface as depicted by new step 5*b* (see FIG. 3*e*). This effectively means that the "process control" or "end point detection" chiplets 11 provide a way to accurately control the thickness of the deposited backside metal 26. The polishing step is completed when the "process control" chiplets become visible, as shown in new step 5*b* depicted by FIG. 3*e*. Because the "process control" chiplets do not polish as quickly as does the deposited metal layer (for example, if copper is used as the metal of the metal layer, it polishes away 100 times faster than does SiC, if SiC is the material selected for the chiplets 11), the chiplets 11 not only become visible, but due to their comparatively greater hardness, they also provide an effective "polishing stop", to prevent significant over-polishing of the metal layer 26.

Chiplets 11 are used for backside metal 26 end point detection and preferably also for backside alignment. These chiplets are 5 to 10 μm thicker than the interposer wafer 20. After metal plating (new step 5*a*), the backside metal 26 is polished back all the way to these chiplets 11—thus the "end point detection" label sometimes used for these chiplets herein. This process accurately controls the backside metal 26 thickness to provide more uniformity and thickness control, thereby also reducing wafer warpage.

FIG. 5 shows the process utilizing the "process control" or "end point detection" chiplets 11 in a block diagram format.

FIG. 6 shows a close-up view of the "process control" or "end point detection" chiplet 11 as seen through the backside metal 26 electroplating and polishing processes. In this figure, the alignment feature, which preferably includes a recessed (possibly etched) alignment mark or marks. Marks are preferably formed on both the upper and lower surfaces of the chiplets 11 before they are mounted as depicted by FIG. 3*a*. The chiplet 11 should be harder than the material selected for metal 26. The backside recessed marks are filled with metal 26 during the plating process but visible after polishing, facilitating dicing the wafer 20 into individual interposer chips.

Appendices A and B show how the chiplets 11 can be inserted into a wafer layout. Appendix A shows a wafer with a plurality (72 in this case) of the individual interposer chips, while Appendix B shows an individual chip with one (in this embodiment) "process control" or "end point detection" chiplet 11 and a plurality of transistor chiplets 10. The "process control" or "end point detection" chiplets 11 may be approximately 300×300 μm in size, but can be smaller (100×100 μm, for example) or larger. Preferably placing one "process control" chiplet per chip reticle (every 10 mm in this embodiment). However, the density could either be increased or decreased based on the process margin.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. An apparatus comprising an electronic element made out of a first wafer, the electronic element having a first wafer thickness with one or more end point thickness control chiplets disposed in through cavities in the electronic element, the one or more end point thickness control chiplets being made out of a second wafer and having a second thickness greater than the first wafer thickness and a first hardness, the electronic element being at least partially covered with a cover material having a hardness less than said first hardness of the end point thickness control chiplets and having a thickness limited by the thickness of the end point thickness control chiplets;

wherein the material of the one or more end point thickness control chiplets is SiC and wherein the cover material is selected from the group consisting of Cu and Al.

2. The apparatus of claim 1 wherein the electronic element has additional through cavities therein with transistor chiplets made out of a third wafer disposed therein.

3. The apparatus of claim 2 wherein a number of the additional through cavities exceed a number of the through cavities in which end point thickness control chiplets are disposed by at least a factor of 10.

4. The apparatus of claim 2 wherein the electronic element has at least a single through cavity in which an end point thickness control chiplet is disposed and a plurality of additional through cavities in which the transistor chiplets are disposed, the electronic component being formed primarily of a first material and the transistor chiplets being formed primarily of a second material.

5. The apparatus of claim 1 wherein the one or more end point thickness control chiplets have one or more alignment marks formed on at least one end surface thereof.

6. An apparatus comprising an electronic element made out of a first wafer, the electronic element having a first surface with one or more end point thickness control chiplets disposed in cavities in the electronic element, the one or more end point thickness control chiplets being made out of a second wafer and protruding from said first surface and having a first hardness, the electronic element being at least partially covered with a cover material having a hardness less than said first hardness of the end point thickness control chiplets and having a thickness limited by a distance by which the one or more end point thickness control chiplets protrude from said first surface;

wherein the one or more end point thickness control chiplets are essentially made out of SiC and the cover material is selected from the group consisting of Cu and Al.

7. The apparatus of claim 6 wherein the electronic element has additional cavities therein with transistor chiplets disposed therein, the transistor chiplets being made out of a third wafer.

8. The apparatus of claim 7 wherein a number of the additional cavities exceeds a number of the cavities in which end point thickness control chiplets are disposed.

9. The apparatus of claim 7 wherein the electronic element has at least a single cavity in which an end point thickness control chiplet is disposed and a plurality of additional cavities in which the transistor chiplets are disposed.

10. The apparatus of claim 6 wherein the one or more end point thickness control chiplets have one or more alignment marks formed on at least one end surface thereof.

* * * * *